United States Patent [19]

Fox et al.

[11] 4,029,972

[45] June 14, 1977

[54] RAMPING CIRCUIT

[75] Inventors: David A. Fox, Lima; James L. Roof, Fort Shawnee, both of Ohio

[73] Assignee: Westinghouse Electric Corporation, Pittsburgh, Pa.

[22] Filed: Dec. 16, 1975

[21] Appl. No.: 641,314

[52] U.S. Cl. .............................. 307/228; 307/263; 328/35; 328/128; 328/185

[51] Int. Cl.² ........................................ H03K 4/08

[58] Field of Search ............... 307/228, 263, 230; 328/35, 127, 128, 182, 184, 185

[56] References Cited

UNITED STATES PATENTS

| 3,444,394 | 5/1969 | Colvson | 307/228 X |
|---|---|---|---|
| 3,814,352 | 6/1974 | Grimes | 307/228 X |

Primary Examiner—John Zazworsky
Attorney, Agent, or Firm—G. H. Telfer

[57] ABSTRACT

A ramping circuit including a comparator and an integrator connected together in a source follower configuration. First and second operational amplifiers in the comparator and integrator sections, respectively, are used with the first having its negative input terminal supplied the input to the ramping circuit and its output terminal connected to the negative input terminal of the second, a feedback loop is provided from the output of the integrator stage to the positive input terminal of the comparator stage.

4 Claims, 2 Drawing Figures

4,029,972

RAMPING CIRCUIT

BACKGROUND OF THE INVENTION

Ramping circuits are for developing an output signal that gradually increases at a predetermined rate in response to an input signal that changes magnitude abruptly. Ramping circuits have general utility in electronic circuitry. Merely one example of a possible application is as a generator of a reference signal for use in certain types of voltage regulators such as that disclosed in the copending application Ser. No. 641,315, filed Dec. 16, 1975 by the present inventors and assigned to the present assignee.

In the past, ramping circuits have been generally characterized by being of the inverting type in which the output is of opposite polarity to the input. It is desirable to produce an output ramping signal that is of the same polarity as the input without being required to reinvert the signal with an additional circuit stage.

SUMMARY OF THE INVENTION

In accordance with the present invention, a ramping circuit is provided including a comparator and an integrator connected together in a source follower configuration. A first operational amplifier (opamp) is connected as a comparator with the input signal to the ramping circuit supplied to its negative input terminal. A second opamp is connected as an integrator with the output terminal of the first opamp connected to the negative input terminal of the second. A feedback loop is provided from the output of the second opamp to the positive input terminal of the first opamp.

The circuit consists of a modified voltage follower circuit whose output ramps at a precisely controlled linear rate. Under steady state conditions, the output of the circuit reaches the input magnitude with no inversion.

Among the desirable qualities of the ramping circuit in accordance with the present invention is that it can be made adjustable to provide linear ramping over a wide range, such as from 0.1 to 5.0 seconds for a given voltage change of 0 to 5 volts DC. The adjustability is provided by adjusting a resistor connected between the two operational amplifier stages.

PREFERRED EMBODIMENT OF THE INVENTION

Figure 1:
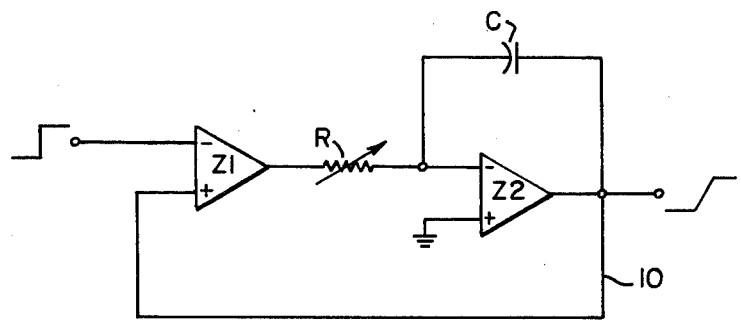
FIG. 1 is a generalized schematic diagram of a ramping circuit in accordance with the present invention.

Referring to FIG. 1, two operational amplifiers Z1 and Z2 are connected as comparator and integrator circuit stages, respectively. The first operational amplifier Z1 has a step changing input signal applied to its negative input terminal. The output of the first operational amplifier Z1 is coupled through resistor R to the negative input terminal of the second operational amplifier Z2 and a feedback path 10 is provided from the output terminal of the second operational amplifier Z2 to the positive input terminal of the first operational amplifier Z1. Additionally, a capacitor C is connected across the negative input terminal and the output terminal of the second operational amplifier Z2.

Capacitor C and the magnitude of resistance R determines the ramping rate. That is, the first operational amplifier Z1 is selected so that it quickly saturates upon the occurrence of the normal stepwise input that is expected and thus provides a constant input voltage to the second operational amplifier Z2 which is connected as an integrator and the time constant is determined by the product of the resistive and capacitive impedances in accordance with the relationship that the saturation voltage of the first stage divided by the resistance and capacitance elements R and C of the second stage equals the ramping rate in volts per second.

It is significant to the practice of the present invention that each of the operational amplifiers Z1 and Z2 has input signals applied to its negative input terminals and that the feedback path 10 is connected from the output terminal to the positive input terminal of the first stage Z1. This connection forms a voltage follower amplifier whose output is equal to and of the same polarity as the input signal, which is the desired result.

Additional characteristics of circuits in accordance with this invention will be discussed in relation to the more specific embodiment of FIG. 2. In addition to the elements shown in FIG. 1, FIG. 2 includes an input resistor R1 connected to the input of the first operational amplifier Z1 and the intermediate resistance between the two operational amplifiers is provided by a fixed resistor R3 in series with an adjustable resistor R4. Additional circuit elements include a parallel capacitor C1 and resistor R2 combination connected across the first operational amplifier Z1 and a diode rectifier CR1 connected between the output of the first operational amplifier Z1 and the input of the second in parallel with the resistance elements R3 and R4.

The time required for operational amplifier Z1 to saturate is determined by the magnitude of resistors R1 and R2 and capacitor C1. This is typically a few milliseconds. The output of Z1, at approximately −13 volts for example for an original step input of zero to plus 5 volts DC, provides a constant input voltage to the second operational amplifier Z2 which is connected as an integrator. The output of Z2 slowly rises at a rate determined by R3, R4 and C2 up to the input magnitude of, for example, plus 5 volts DC. At this point the inputs of Z1 are balanced and the output of Z1 returns to zero so that Z2 stops ramping and the output of the circuit is steady.

The presence of the diode CR1 is for the purpose of providing a much faster ramping rate for a decreasing input signal than for an increasing signal as shown. In the operation previously described in which a negative valued output occurs from Z1, the diode CR1 will not come into play since it has a blocking polarity. If it occurs that the output of Z1 is positive, the diode CR1 connected as shown will short circuit the resistance elements R3 and R4. If it were desired to control the fall time of the ramp instead of the rise time, the CR1 may be reversed in polarity. Also, another value of resistance may be placed in series with CR1 to control both the rise and fall times, but at different rates.

Figure 2:
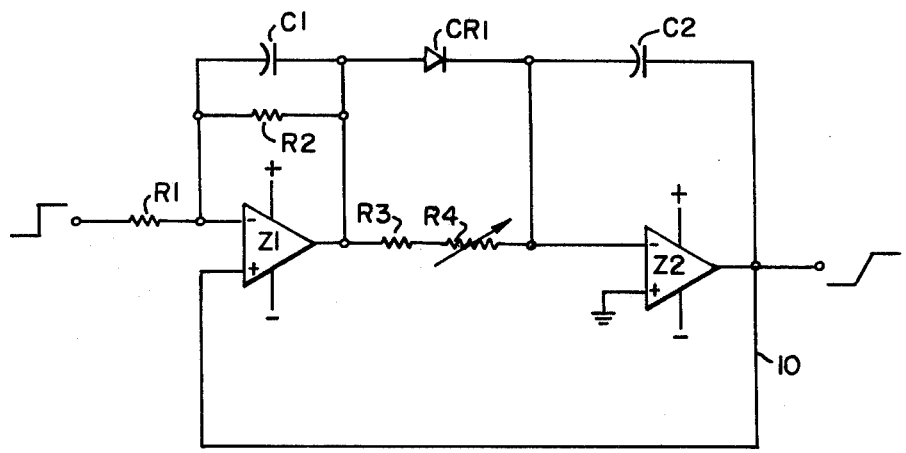
FIG. 2 is a schematic diagram of a more specific embodiment of the invention.

By way of further example, the following is a table of typical suitable values for components as illustrated in the circuit of FIG. 2. With this circuit using these components the positive going ramp rate of the circuit may be varied from less than 1 volt per second to more than 50 volts per second with the reset ramp rate of more than 100 volts per second.

Z1 and Z2; Type 741

R1 and R3; 1000 ohms
R2; 1 Megohm
R4; 100,000 ohms, adjustable
C1; 0.01 microf.
C2; 200 microf.
CR1; 1N486B It is therefore seen that the present invention provides a ramping circuit that is simple to construct and whose output is truly linear and can be precisely controlled over a wide range merely by changing resistance values with up and down ramp rates being independently variable. The invention may take various additional forms within the scope of the invention.

We claim:

1. A ramping circuit comprising:
    an input terminal for receiving an input signal that may vary abruptly in magnitude;
    a first operational amplifier having positive and negative input terminals and an output terminal, said input terminal being electrically coupled to said negative input terminal of said first operational amplifier;
    a second operational amplifier having positive and negative input terminals and an output terminal, said negative input terminal of said second operational amplifier being electrically coupled to said output terminal of said first operational amplifier by a first circuit branch including a resistance and by a second circuit branch, in parallel with said first branch, including a diode rectifier poled to conduct from said first to said second operational amplifier to provide rapid reset of the ramping circuit, said positive input terminal of said second operational amplifier being maintained at a reference potential; and
    a feedback circuit branch from said output terminal of said second operational amplifier to said positive input terminal of said first operational amplifier to provide at said output terminal of said second operational amplifier a linear signal gradually changing between levels corresponding to two levels of said input signal and in the same direction as the change in said input signal.

2. A ramping circuit in accordance with claim 1 wherein:
    a capacitor is connected across said negative input terminal and said output terminal of said second operational amplifier, said resistance of said first circuit branch and said capacitor values determining the ramping rate.

3. A ramping circuit in accordance with claim 1 wherein:
    said first operational amplifier is characterized by saturating upon a normally occuring abrupt change in input voltage and thereupon supplies a constant voltage to said second operational amplifier, the saturated condition of said first operational amplifier being maintained for so long as the input signal exceeds the output signal.

4. A ramping circuit in accordance with claim 3 wherein:
    a second capacitor and a second resistance are connected mutually in parallel across said negative input terminal and said output terminal of said first operational amplifier for determining the saturation time of said first operational amplifier.

* * * * *